US006087855A

United States Patent [19]

[11] Patent Number: 6,087,855

[45] Date of Patent: Jul. 11, 2000

Frederick, Jr. et al.

[54] HIGH PERFORMANCE DYNAMIC MULTIPLEXERS WITHOUT CLOCKED NFET

[75] Inventors: Marlin Wayne Frederick, Jr., Cedar Park; Donald George Mikan, Jr.; Eric Bernard Schorn, both of Austin, all of Tex.

[73] Assignee: International Business Machines Corporation, Armonk, N.Y.

[21] Appl. No.: 09/094,711

[22] Filed: Jun. 15, 1998

[51] Int. Cl.[7] .................... H03K 19/084; H03K 19/096; H03K 17/62

[52] U.S. Cl. ............................ 326/106; 326/105; 326/98; 326/112; 327/408

[58] Field of Search ................................. 326/93, 95, 98, 326/121, 119, 112, 27, 28, 105, 106, 108; 327/403, 407, 408

[56] References Cited

U.S. PATENT DOCUMENTS

| | | | |
|---|---|---|---|
| 5,093,588 | 3/1992 | Ando et al. | 326/86 |
| 5,543,731 | 8/1996 | Sigal et al. | 326/40 |
| 5,654,660 | 8/1997 | Orgill et al. | 327/407 |
| 5,748,012 | 5/1998 | Beakes et al. | 326/93 |
| 5,796,270 | 8/1998 | Fifield et al. | 326/86 |

*Primary Examiner*—Michael Tokar
*Assistant Examiner*—James A. Cho
*Attorney, Agent, or Firm*—Kelly K. Kordzik; Winstead Sechrest & Minick P.C.; Anthony V. S. England

[57] ABSTRACT

Performance is increased within a dynamic multiplexer by removing the foot device and replacing it with a logic gate (such as an OR, NOR, or NAND gate) receiving the select signals and activating the precharge device within the dynamic multiplexer circuit. With such a configuration, crowbar current is still inhibited.

26 Claims, 3 Drawing Sheets

HIGH PERFORMANCE DYNAMIC MULTIPLEXERS WITHOUT CLOCKED NFET

TECHNICAL FIELD

The present invention relates in general to logic circuitry, and in particular, to dynamic logic circuitry.

BACKGROUND INFORMATION

Multiplexers are one of the most commonly used functions in microprocessors and other integrated circuits. Multiplexers can be implemented in a large number of circuit families, each with various topologies. Dynamic multiplexers are generally used where high performance is critical.

A typical dynamic multiplexer is illustrated in FIG. 1, where s(0 . . . 3) are the pre-decoded select signals and d(0 . . . 3) are the corresponding data signals. This prior art dynamic/domino multiplexer circuit includes an NFET "foot" device (where the gate is connected to clock (clk)) in series with an NFET for select and another NFET for data. This results in a three-high n-stack (note that the "foot" device performs no logical function).

Such a "foot" device is implemented to eliminate "crowbar current" from occurring in such dynamic circuits. Crowbar current occurs when there is no foot device activated by the clock, and current is able to shoot down through the n-stack from the precharge node during the transition between the precharge and the evaluate phases.

Nevertheless, such a foot device introduces complexity into the circuit along with an increase in the height of the n-stack, a loading upon the clock signal, and an increase in area and power consumption of the circuit. As a result, there is a need in the art for a multiplexer that does not require such a foot device yet does not suffer from crowbar current.

SUMMARY OF THE INVENTION

The present invention addresses the foregoing need by providing an improvement in a dynamic multiplexer that has increased performance, a reduced n-stack height, reduced clock loading, a reduction in area and a reduction in power consumption.

The present invention removes the foot device without introducing crowbar current or the complexity of clock delay chains.

In one embodiment of the present invention, the foot device is replaced by an OR circuit receiving the select inputs and having its output connected to the gate of the precharge device.

In another embodiment of the present invention, the OR circuit is replaced by a NAND circuit, which receives the complements of the select signals, and has its output connected to the precharge device.

In yet another embodiment of the present invention, the OR circuit also receives the clock signal along with the select signals.

In yet still another embodiment of the present invention, the NAND circuit receives a complement of the clock signal along with the complements of the select signals.

In yet another embodiment of the present invention, a NOR circuit has its output connected to the precharge device and receives the select inputs. The precharge device is an NFET, and the circuit also utilizes a half-latch to complete the full-rail precharge of the evaluation node of the multiplexer.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
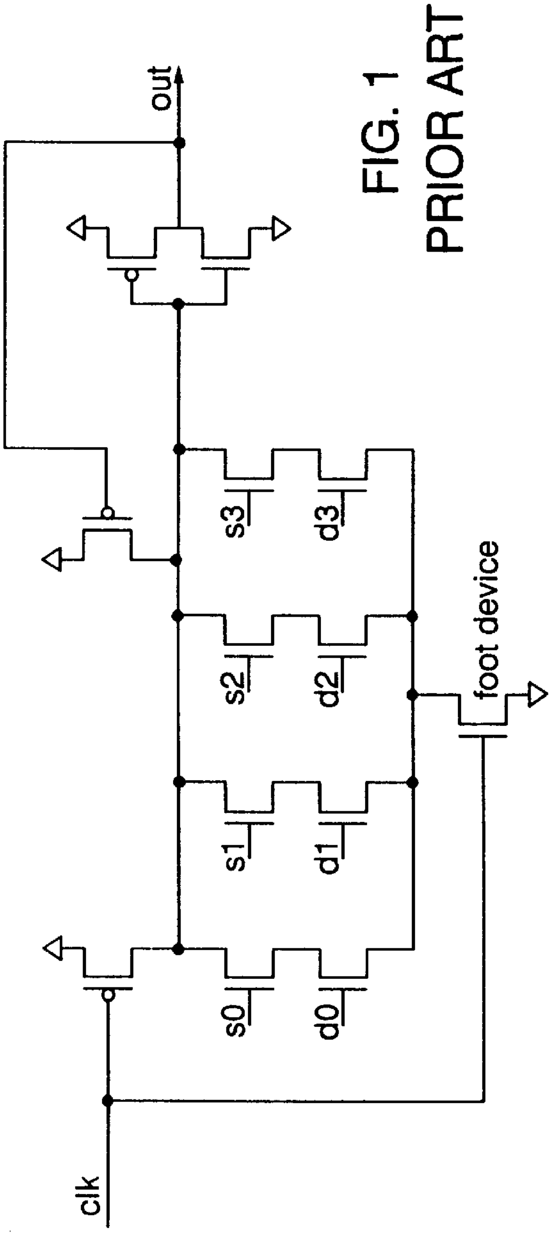
FIG. 1 illustrates a prior art multiplexer circuit.

In the following description, numerous specific details are set forth such as the width of a multiplexer circuit to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

The following circuits described with respect to FIGS. 2–6 are implemented with four data inputs and four corresponding select signals. However, each embodiment of the present invention may be implemented with any other number of data inputs and corresponding select inputs.

Figure 4:
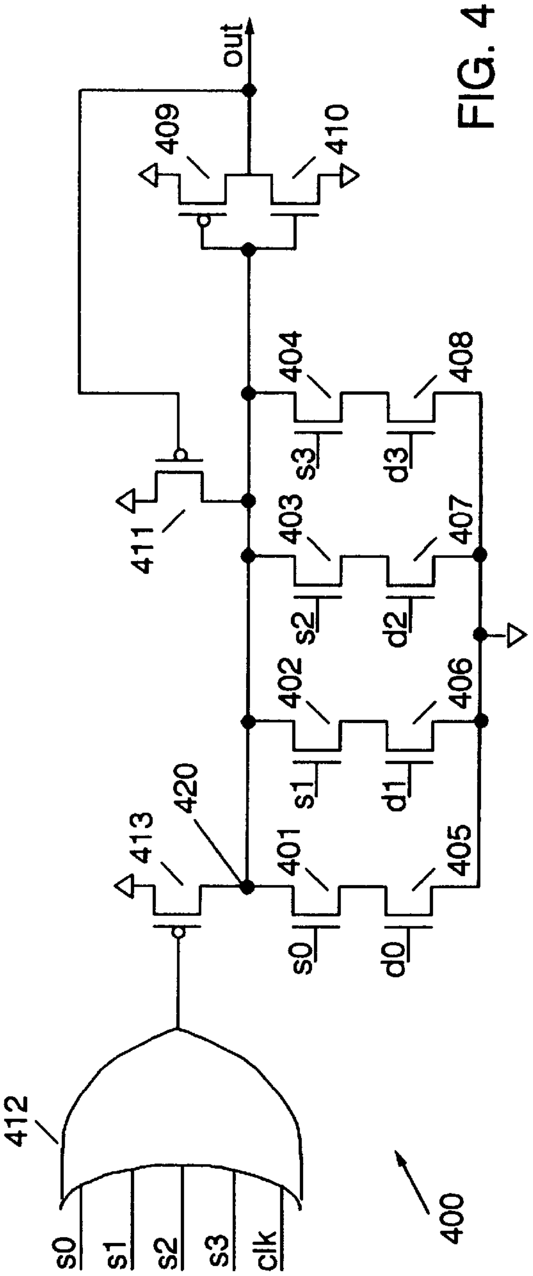
FIG. 4 illustrates an alternative embodiment of a multiplexer circuit in accordance with the present invention.
Figure 5:
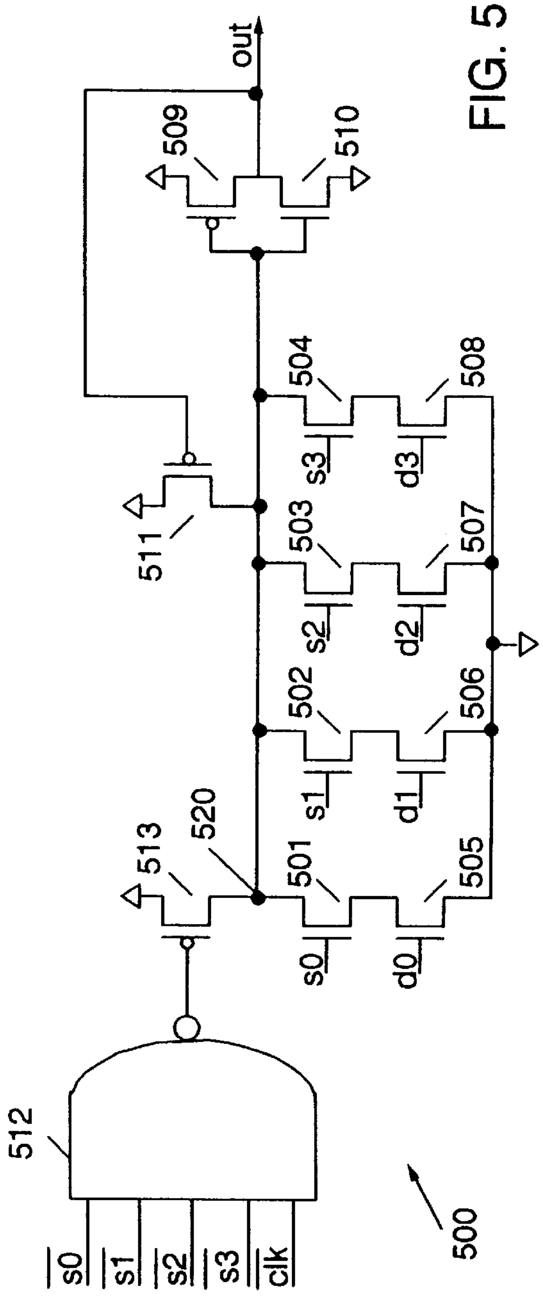
FIG. 5 illustrates an alternative embodiment of a multiplexer circuit in accordance with the present invention.
Figure 6:
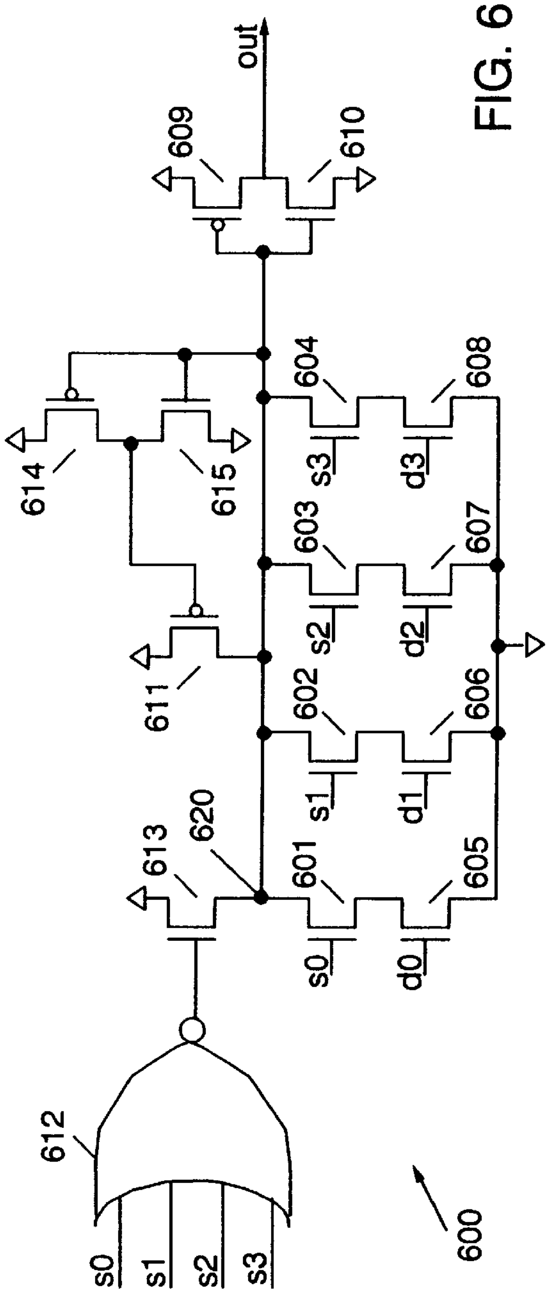
FIG. 6 illustrates an alternative embodiment of a multiplexer circuit in accordance with the present invention.

FIGS. 2–5 illustrate various embodiments of the present invention where the select signals are not within any critical path through the circuit. FIG. 6, as further described below, illustrates an alternative embodiment of the present invention where one or more of the select signals is in the critical path through the circuit.

Since the selects are inactive (low) for roughly one-half cycle preceding the arrival of the data, and they arrive before the data, they can be ORed (NOR+INV) together and the result used to precharge the multiplexer. In this case, the NFET "foot" device can be removed and the performance increased significantly. Because the select signals arrive early and they control the precharge signal through the "fast side" of the OR gate, there will be no "crowbar current" through the precharge node (nodes 220, 320, 420, 520 and 620 in FIGS. 2–6) and n-stack FETs at the end of the precharge. If the multiplexers' input data signals are driven from a domino circuit on the same phase of the clock signal as the select signals, the multiplexer will not precharge until well after the data goes inactive, since the delay through the "slow side" of the OR gate is designed to be longer than the data precharge delay. This prevents any "crowbar current" at the start of the precharge.

Figure 2:
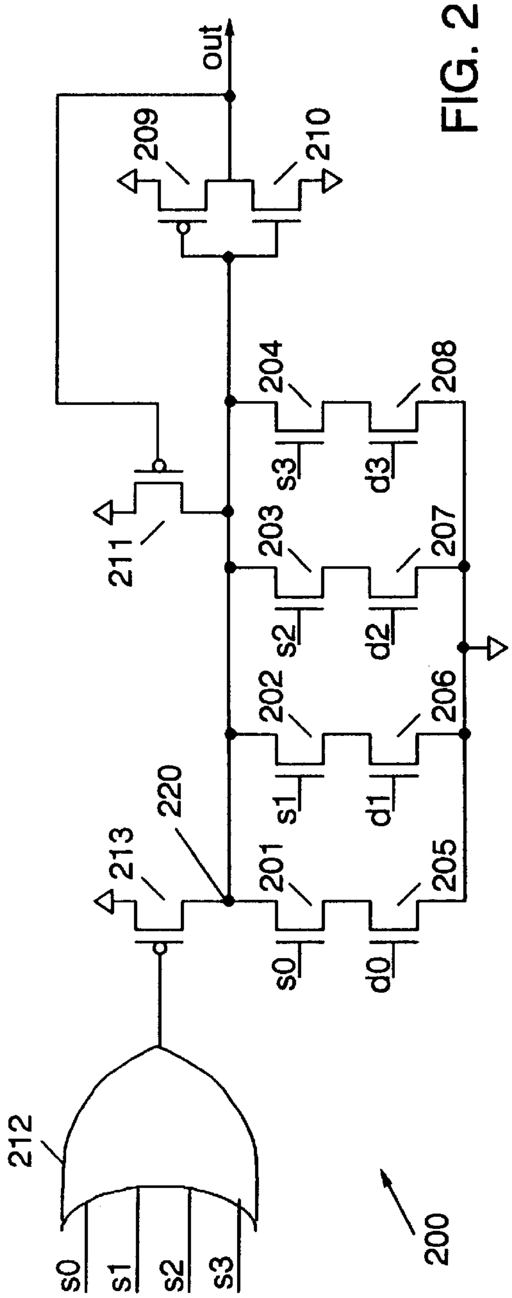
FIG. 2 illustrates one embodiment of a multiplexer circuit in accordance with the present invention.

A single OR gate 212 illustrated in FIG. 2 would reside adjacent to any select buffers (not shown) and would be replicated once for each row. OR gate 212 receives the select signals s(0 . . . 3), and has its output connected to the gate of PFET 213 in order to precharge multiplexer 200. The select signals s(0 . . . 3) are received by NFETs 201–204, respectively, while data signals d(0 . . . 3) are received by NFETs 205–208, respectively.

During the evaluate phase of multiplexer 200, one of the data signals d(0 . . . 3) will be selected by its corresponding select vector s(0 . . . 3). Once selected, the data signal will conditionally discharge node 220. The inverter circuit, PFET 209 and NFET 210, returns the output to an active high level. PFET 211 acts as a keeper device to prevent inadvertent evaluation.

Figure 3:
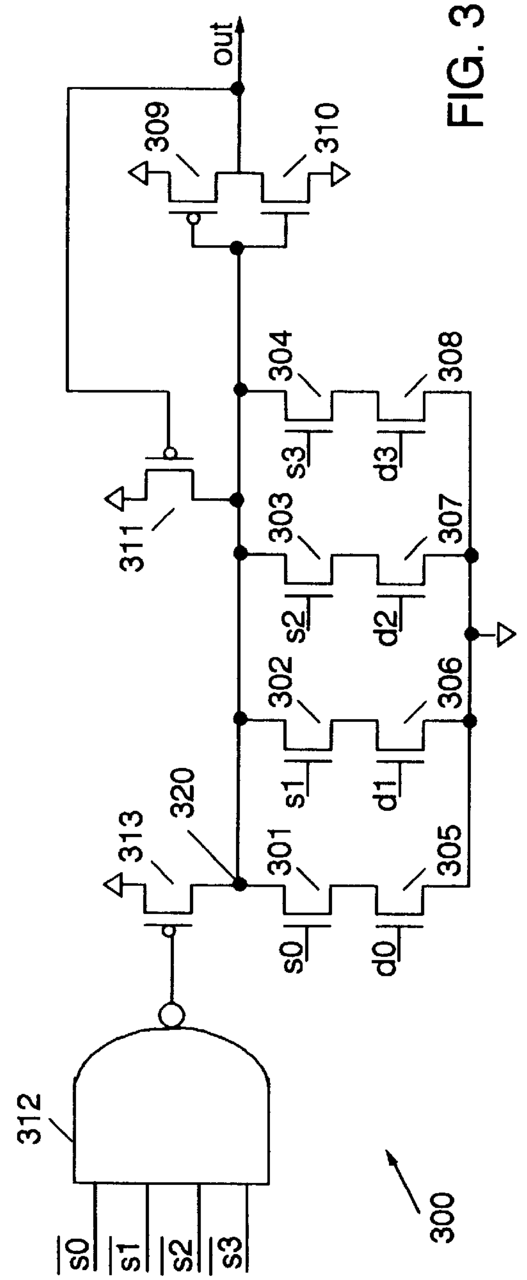
FIG. 3 illustrates an alternative embodiment of a multiplexer circuit in accordance with the present invention.

FIG. 3 illustrates an alternative embodiment of the present invention. In multiplexer 300, devices 301–311 operate similarly to devices 201–211 in multiplexer 200. Active low select signals (the complement of s(0 . . . 3)) are NANDed by NAND gate 312 to create the precharge signal received by PFET 313. These signals can be sourced from internal "dynamic" nodes of associated (and adjacent) select buffers (not shown).

The multiplexer precharge signal can be forced inactive even before the select signals arrive if the appropriate clock signal is included in the OR/NAND precharge generation circuit. This modification will reduce the delay of the select signals through the multiplexer and would be appropriate when the select is the critical path. These multiplexer configurations are illustrated in FIGS. 4 and 5. Multiplexer 400 illustrated in FIG. 4 includes devices 401–411 operating similarly to devices 201–211 of multiplexer 200. OR gate 412 operates similarly to OR gate 212, except that the clock (clk) signal is also received by OR gate 412 for activating the precharge device 413.

Multiplexer 500 operates similarly in that devices 501–511 operate similarly to devices 201–211. Additionally, NAND gate 512 operates similarly to NAND gate 312, except that the complement of the clock signal is also received by NAND gate 512 for activating PFET 513.

Another alternative embodiment of the present invention utilizes a NOR gate driving an NFET to effect the precharge in the multiplexer. This is illustrated in FIG. 6 with multiplexer circuit 600. Devices 601–610 operate similarly to devices 201–210. NOR gate 612 receives the select signals s(0 . . . 3) for activating precharge NFET 613. A full-rail precharge is implemented with PFET 611 and 614 and NFET 615 connected as shown.

Although the present invention and its advantages have been described in detail, it should be understood that various changes, substitutions and alterations can be made herein without departing from the spirit and scope of the invention as defined by the appended claims.

What is claimed is:

1. A multiplexer comprising:

circuitry for outputting one of a plurality of received data signals in response to receipt of a plurality of select signals;

a precharge device coupled to the circuitry for outputting one of the plurality of received data signals in response to receipt of the plurality of select signals; and a logic gate receiving the plurality of select signals and coupled to the precharge device wherein the precharge device is a FET, and wherein an output of the logic gate is connected to a gate of the FET.

2. The multiplexer as recited in claim 1, wherein the logic gate is an OR gate.

3. The multiplexer as recited in claim 2, wherein the OR gate also receives a clock signal.

4. The multiplexer as recited in claim 2, wherein the precharge FET is a PFET.

5. The multiplexer as recited in claim 1, wherein the logic gate is a NOR gate.

6. The multiplexer as recited in claim 5, wherein the precharge FET is an NFET.

7. The multiplexer as recited in claim 1, wherein the logic gate is a NAND gate.

8. The multiplexer as recited in claim 7, wherein the NAND gate also receives a clock signal.

9. The multiplexer as recited in claim 8, wherein the NAND gate receives complements of the select signals and the clock signal.

10. The multiplexer as recited in claim 7, wherein the NAND gate receives complements of the select signals.

11. A dynamic multiplexer circuit comprising:

first and second NFETs coupled in series between a node and ground, wherein the first NFET receives a first select signal at its gate, and wherein the second NFET receives a first data signal at its gate;

a FET coupled between a power source and the node; and a logic gate receiving the first select signal, wherein an output of the logic gate is coupled to a gate of the FET.

12. The circuit as recited in claim 11, further comprising:

third and fourth NFETs coupled in series between the node and ground, wherein the third NFET receives a second select signal at its gate, and wherein the fourth NFET receives a second data signal at its gate.

13. The circuit as recited in claim 12, wherein the first select signal operates to output the first data signal from the circuit, and wherein the second select signal operates to output the second data signal from the circuit.

14. The circuit as recited in claim 12, wherein the logic gate also receives the second select signal.

15. The circuit as recited in claim 14, wherein the logic gate also receives a clock signal.

16. The multiplexer as recited in claim 15, wherein the logic gate is a NAND gate.

17. The multiplexer as recited in claim 16, wherein the NAND gate receives complements of the select signals and the clock signal.

18. The multiplexer as recited in claim 15, wherein the logic gate is an OR gate.

19. The circuit as recited in claim 14, further comprising:

an inverter having an input connected to the node and having an output connected to an output of the circuit; and a second FET coupled between the power source and the node.

20. The circuit as recited in claim 19, wherein a gate of the second FET is connected to the output of the circuit.

21. The circuit as recited in claim 19, further comprising:

a first PFET coupled between a second node and the power source; and a fifth NFET coupled between the second node and ground, wherein a gate of the second FET is connected to the second node.

22. The multiplexer as recited in claim 14, wherein the logic gate is an OR gate.

23. The multiplexer as recited in claim 14, wherein the logic gate is a NOR gate.

24. The multiplexer as recited in claim 23, wherein the FET is an NFET.

25. The multiplexer as recited in claim 14, wherein the logic gate is a NAND gate.

26. The multiplexer as recited in claim 25, wherein the NAND gate receives complements of the select signals.

* * * * *